United States Patent
Kim et al.

(10) Patent No.: US 7,011,911 B2
(45) Date of Patent: Mar. 14, 2006

(54) MASK FOR POLYCRYSTALLIZATION AND METHOD OF MANUFACTURING THIN FILM TRANSISTOR USING POLYCRYSTALLIZATION MASK

(75) Inventors: Hyun-Jae Kim, Seongnam (KR); Sook-Young Kang, Seoul (KR); Myung-Koo Kang, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/663,081

(22) Filed: Sep. 16, 2003

(65) Prior Publication Data

US 2004/0106241 A1 Jun. 3, 2004

(30) Foreign Application Priority Data

Sep. 16, 2002 (KR) .............. 10-2002-0056138

(51) Int. Cl.
*G03F 9/00* (2006.01)
(52) U.S. Cl. .................... 430/5; 438/149; 438/150; 438/166; 438/308; 438/487
(58) Field of Classification Search ............... 430/5; 438/149, 150, 166, 308, 487
See application file for complete search history.

(56) References Cited

U.S. PATENT DOCUMENTS 5,914,202 A * 6/1999 Nguyen et al. ............... 430/5

\* cited by examiner

*Primary Examiner*—Christopher G. Young
(74) *Attorney, Agent, or Firm*—Cantor Colburn LLP

(57) ABSTRACT

In a method of manufacturing a thin film transistor according to the present invention, an amorphous silicon thin film is firstly formed on an insulating substrate and a planarization layer is formed thereon. Thereafter, the amorphous silicon thin film is crystallized by a solidification process using a laser-irradiation to form a polysilicon thin film. Next, the polysilicon thin film and the planarization layer are patterned to form a semiconductor layer, and a gate insulating layer covering the semiconductor layer is formed. Then, a gate electrode is formed on the gate insulating layer opposite the semiconductor layer. Next, impurities are implanted into the semiconductor layer to form a source region and a drain region opposite each other with respect to the gate electrode, and a source electrode and a drain electrode electrically connected to the source region and the drain region, respectively, are formed.

17 Claims, 7 Drawing Sheets

MASK FOR POLYCRYSTALLIZATION AND METHOD OF MANUFACTURING THIN FILM TRANSISTOR USING POLYCRYSTALLIZATION MASK

BACKGROUND OF THE INVENTION 1. (a) Field of the Invention

The present invention relates to a mask for polycrystallization and a method of manufacturing a thin film transistor using polycrystallization mask.

2. (b) Description of the Related Art

In general, a liquid crystal display ("LCD") includes two panels with electrodes and a liquid crystal layer interposed therebetween. The two panels are combined with a sealant for sealing the liquid crystal layer, which is printed around the edges of the panels. The panels are supported by spacers distributed therebetween.

This LCD displays desired images by applying electric field using the electrodes to the liquid crystal layer with dielectric anisotropy and adjusting the strength of the electric field to control the amount of light passing through the panels. In this case, thin film transistors (TFTs) are used for controlling signals transmitted to the electrodes.

The most commonly used TFTs for an LCD adapts amorphous silicon as a semiconductor layer.

An amorphous silicon TFT has mobility of about 0.5 to 1 $cm^2$/Vsec, which is suitable for a switching element of an LCD. However, it is not sufficient for a driving circuit of a display device such as an LCD or an organic EL (electro luminescent) device.

In order to overcome such a problem, an organic EL or a polysilicon TFT LCD using a polysilicon with electron mobility of 20 to 150 $cm^2$/Vsec as a semiconductor layer has been developed. The relatively high electron mobility polysilicon TFT enables to implement a chip in glass technique that a display panel embeds its driving circuits.

In recent years, one of the most widely used methods of forming a polysilicon thin film on a glass substrate with a low melting point is an eximer laser annealing technique. The technique irradiates light with the wavelength, which can be absorbed by amorphous silicon, from an eximer laser into a amorphous silicon layer deposited on a substrate to melt the amorphous silicon layer at 1,400° C., thereby crystallizing the amorphous silicon into polysilicon. The crystal grain has a relatively uniform size ranging about 3,000–5,000 Å, and the crystallization time is only about 30–200 nanoseconds, which does not damage the glass substrate. However, there are disadvantages that non-uniform grain boundaries decrease the uniformity for electrical characteristics between the TFTs and make it hard to adjust the microstructure of the grams.

To solve these problems, a sequential lateral solidification process capable of adjusting the distribution of the grain boundaries has been developed. The process is based on the fact that the grains of polysilicon at the boundary between a liquid phase region exposed to laser beam and a solid phase region not exposed to laser beam grow in a direction perpendicular to the boundary surface. A mask having a slit pattern is provided, and a laser beam passes through transmittance areas of the mask to completely melt amorphous silicon, thereby producing liquid phase regions arranged in a slit pattern. Thereafter, the melted amorphous silicon cools down to be crystallized, and the crystal growth starts from the boundaries of the solid phase regions not exposed to the laser beam, and proceeds in the directions perpendicular to the boundary surface. The grains stop growing when they encounter each other at the center of the liquid phase region. This process is repeated after moving the slit pattern of the mask in the direction of the grain growth, and thus the sequential lateral solidification covers the whole area. The sizes of the grains can be as much as the widths of the slit pattern.

After the sequential lateral solidification, protuberances of about 400–1,000 Å are formed on the surface of the polysilicon layer along the grain boundaries. These causes stress on the boundary surface of a gate insulating layer to be formed on the semiconductor layer. The stress in this process is found to be ten times more than that in the eximer laser annealing, and this results in degrading the characteristics of the TFTs.

In addition, a dehydrogenation process for removing hydrogen contained in the amorphous silicon is required before the crystallization. Accordingly, the manufacturing method is complicated.

SUMMARY OF THE INVENTION

A motivation of the present invention is to provide a mask for polycrystallization and a method of manufacturing a thin film transistor capable of solving the problems of conventional techniques.

A polycrystallization mask for laser illumination for converting amorphous silicon into polysilicon is provided, which includes: a plurality of first transmissive areas having a first transmittance; a plurality of second transmissive areas having a second transmittance different from the first transmittance; and an opaque area, wherein the first and the second transmissive areas have shapes of slits having width and length.

It is preferable that the first transmissive areas include a translucent film and/or the second transmissive areas are openings.

The slits including the first and the second transmissive areas are preferably arranged with a transverse pitch in a length direction and with a longitudinal pitch in a width direction to form a plurality of slit columns arranged with a second pitch substantially equal to half of the transverse pitch.

The slits in adjacent two of the slit columns are preferably offset by a half of the longitudinal pitch.

Preferably, each slit column includes either of the first transmissive areas and the second transmissive areas and the slit columns include first and second columns adjacent to each other and including the first transmissive areas and third and fourth columns adjacent to each other and including the second transmissive areas.

The first and the second columns and the third and the fourth columns are preferably alternately arranged in the length direction.

A polycrystallization mask for laser illumination for converting amorphous silicon into polysilicon is provided, which includes: a plurality of first areas including a plurality of first slit portions having a first transmittance and a first opaque portion; and a plurality of second areas including a plurality of second slit portions having a second transmittance and a second opaque portion.

Preferably, the first areas and the second areas are alternately arranged, and the first slit portions include a translucent film while the second slit portions include openings.

It is preferable that the first and the second slit portions are arranged with a first pitch in a first direction and the first or the second slit portions in each of the first and the second areas include fifth and sixth slit portions offset with a half of the first pitch in a second direction.

The first or the second slit portions in each of the first and the second areas may form two slit columns.

A method of manufacturing a thin film transistor is provided, which includes: forming an amorphous silicon thin film on an insulating substrate; forming a polysilicon thin film by irradiating the amorphous silicon thin film with a laser beam with an exposure mask including a plurality of slit portions, the slit portions having at least two transmittances, and crystallizing the amorphous silicon thin film; patterning the polysilicon thin film to form a semiconductor layer; forming a gate insulating layer on the semiconductor layer; forming a gate electrode on the gate insulating layer opposite the semiconductor layer; implanting impurities into the semiconductor layer to form a source region and a drain region opposite each other with respect to the gate electrode; and forming a source electrode and a drain electrode electrically connected to the source region and the drain region, respectively.

The method may further include: forming a passivation layer having a contact hole exposing the drain electrode; and forming a pixel electrode connected to the drain electrode via the contact hole.

Preferably, the slit portions includes a plurality of first slit portions having a first transmittance and a plurality of second slit portions having a second transmittance and the exposure mask includes a plurality of first areas including the first slit portions and a plurality of second areas including the second slit portions.

It is preferable that the first areas and the second areas are alternately arranged and the first slit portions include a translucent film while the second slit portions include openings.

Preferably, the first and the second slit portions are arranged with a first pitch in a first direction and the first or the second slit portions in each of the first and the second areas include fifth and sixth slit portions offset with a half of the first pitch in a second direction.

The first or the second slit portions in each of the first and the second areas preferably form two slit columns.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF PREFERRED EMBODIMENTS

Figure 1:
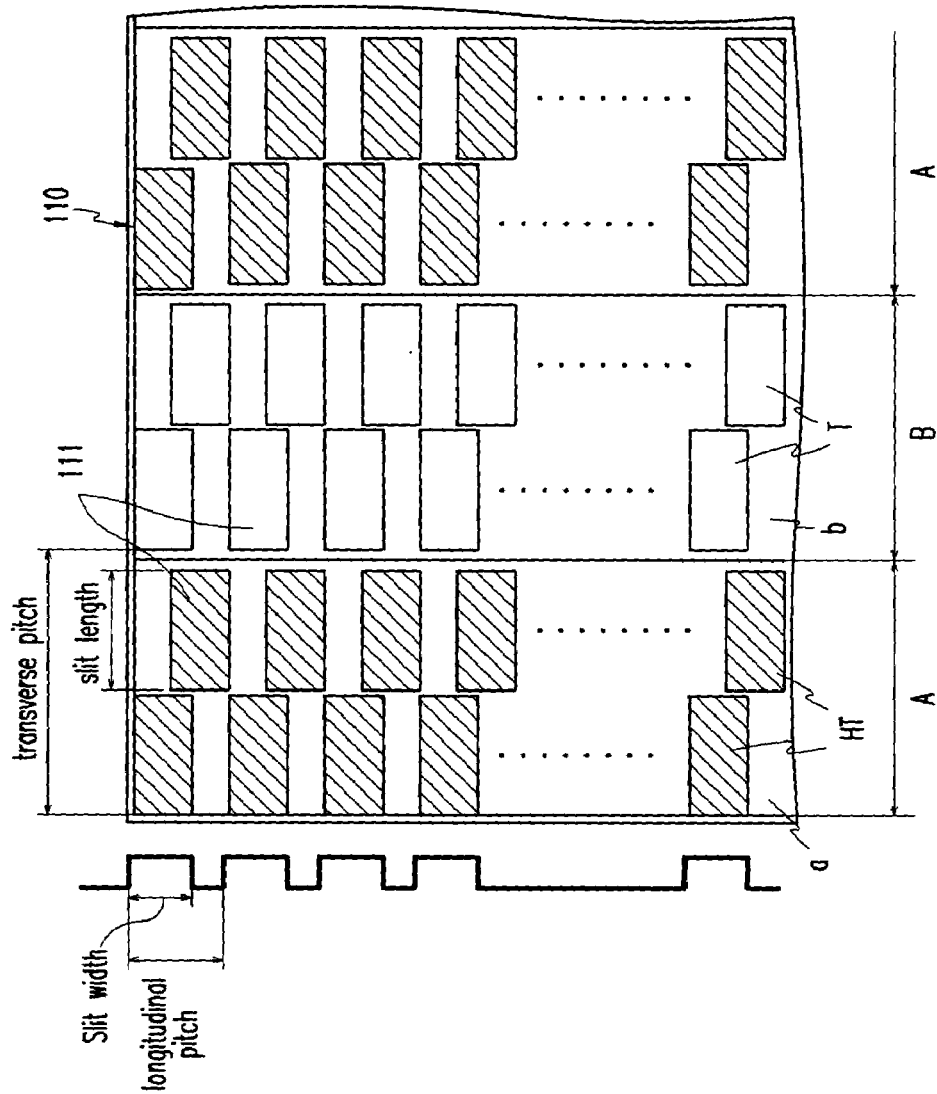
FIG. 1 is a plan view of a mask for polycrystallization according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, a mask for polycrystallization and a method of manufacturing a polysilicon TFT according to embodiments of the present invention will be described with reference to accompanying drawings.

According to an embodiment of the present invention, amorphous silicon is polycrystallized a sequential lateral solidification process. That is, portions of the amorphous silicon is completely melted to form a plurality of liquid phase regions arranged in a slit pattern by passing a laser beam through slit-shaped transmissive areas of a mask. Then, grains grow in the directions perpendicular to the boundaries of solid phase regions. The mask is designed such that the transmittance of the transmissive areas has at least two values.

A mask for polycrystallization according to an embodiment of the present invention is described with reference to FIG. 1.

FIG. 1 is a plan view of a mask for polycrystallization according to an embodiment of the present invention, which is an exposure mask used in a sequential lateral solidification process.

Referring to FIG. 1, a mask 110 according to an embodiment of the present invention includes a plurality of transmissive areas having shapes of slits 111. Each slit 111 is elongated in a transverse direction and has a width and a length. The slits 111 form a plurality of slit columns and the slits 111 in each column are arranged with a predetermined pitch (referred to as the "longitudinal pitch" hereinafter). The slits 111 in adjacent two columns are offset by about half of the pitch. The slits 111 are arranged in a row direction with a predetermined pitch (referred to as the "transverse pitch" hereinafter).

The transmittance of the slits 111 has two values alternating every two columns. In other words, two areas A and B having the slits 111 with different transmittances are alternately arranged. For example, the slits 111 in the areas A are translucent, while the slits in the areas B are transparent. Each translucent slit 111 in the areas A includes a translucent film HT that can partly transmit a laser beam, while each transparent slit 111 includes no film or a transparent film that can completely transmit a laser beam.

According to an embodiment of the present invention, the mask 110 is prepared by depositing an opaque film such as a Cr film, patterning the opaque film to form a plurality of openings, depositing a translucent film, and removing portions of the translucent film on the areas B. Accordingly, the opaque areas a in the areas A include the opaque film and the translucent film, while the opaque areas b in the areas B include only the opaque film.

An exemplary sequential lateral solidification process using the mask shown in FIG. 1 includes a dehydrogenation step, a polycrystallization step, and a protuberance removal step, which is described in detail with reference to FIGS. 2A–2F.

FIGS. 2A–2F are section views illustrating a sequential lateral solidification using the mask shown in FIG. 1 according to an embodiment of the present invention.

Figure 2A:
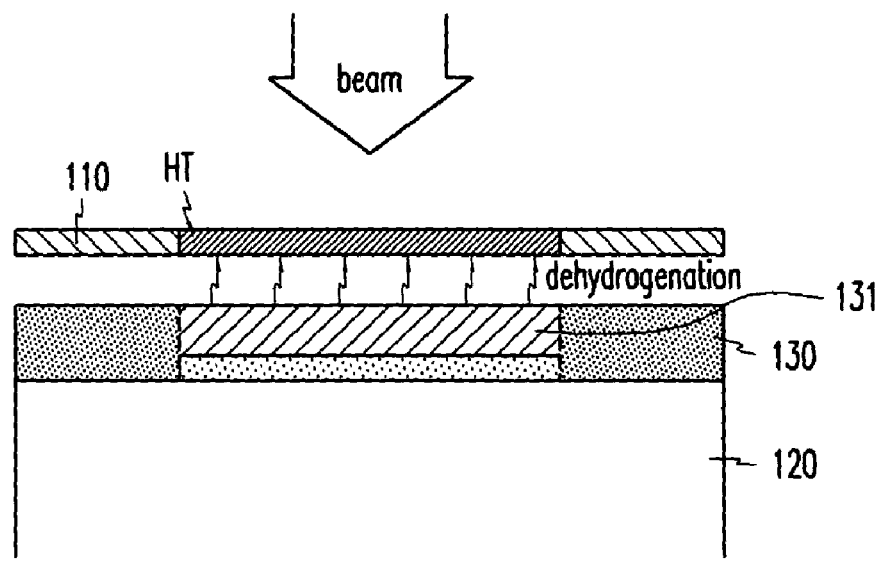
FIGS. 2A–2F are section views illustrating a sequential lateral solidification using the mask shown in FIG. 1 according to an embodiment of the present invention.

Referring to FIG. 2A, an amorphous silicon film 130 is deposited on an insulating substrate 120 by chemical vapor deposition (CVD). The polycrystallization mask 110 shown in FIG. 1 is aligned with the substrate 120 and a laser beam is illuminated through the mask 110. The translucent film HT in the translucent slits 111 makes portions of the amorphous silicon film 130 opposite thereto be melted in part to form liquid phase regions 131 on the top of the portions as shown in FIG. 2A. The hydrogen contained in the portions of the amorphous silicon film 130 opposite the translucent film HT is evaporated to be removed from the liquid phase regions 131.

Figure 2B:
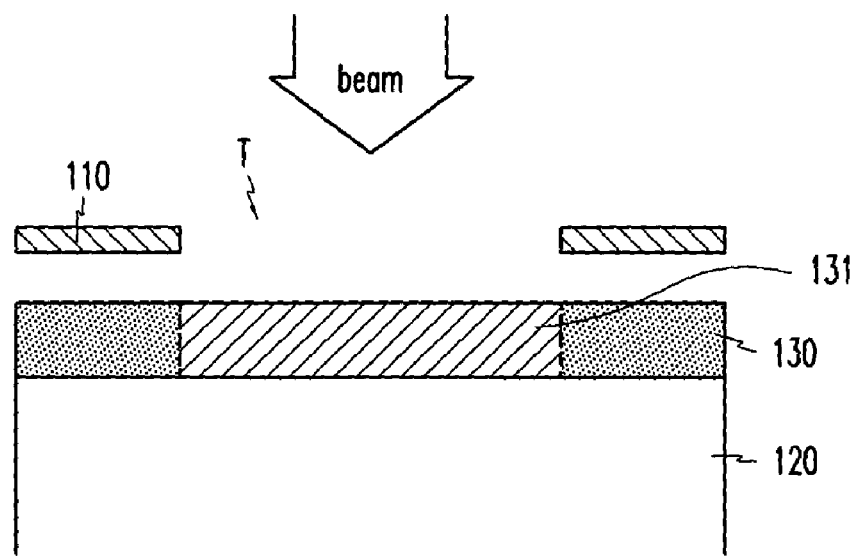

Referring to FIG. 2B, the polycrystallization mask 110 is moved in a transverse direction by the transverse pitch such that the openings T of the transparent slits 111 are aligned with the portions of the amorphous silicon film 130, which have experienced the dehydrogenation. The illumination of a laser beam through the mask 110 makes the portions be liquid phase regions 131.

Figure 2C:
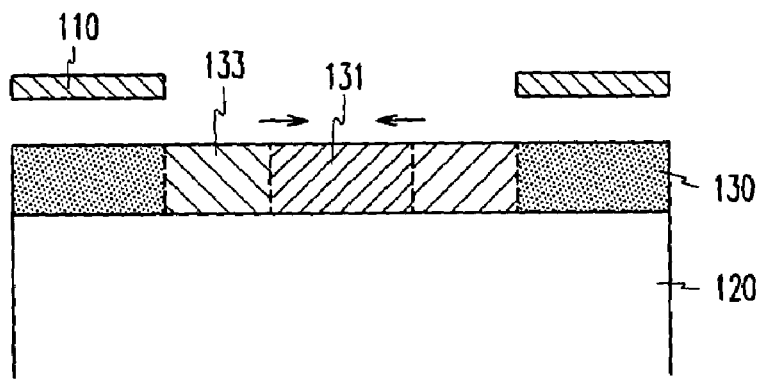

Referring to FIG. 2C, the liquid amorphous silicon in the liquid phase regions 131 is cooled down to be crystallized. The crystallization starts from boundary surfaces of the liquid phase regions 131 contacting solid phase regions, which are not exposed to the laser beam, and proceeds in directions perpendicular to the boundary surfaces, which are indicated by arrows in FIG. 2C. Reference numeral 133 indicates crystallized regions or grains.

Figure 2D:
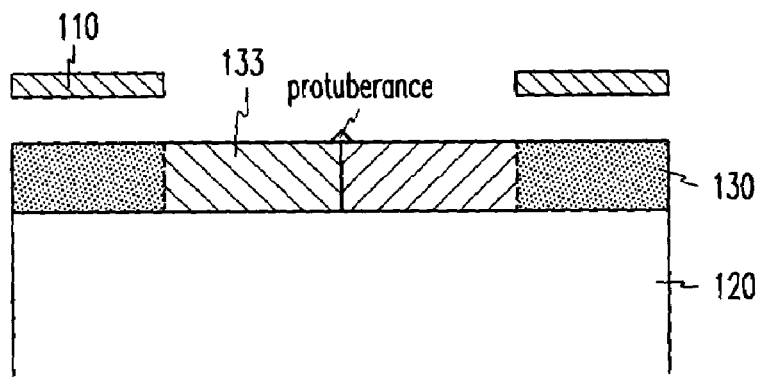

Referring to FIG. 2D, the growth of grains is stopped when the grains reach a center of the liquid phase regions 131 and protuberances having a size of about 400–1,000 Å are formed on the surfaces of the crystallized regions 133 near the center along grain boundaries.

Figure 2E:
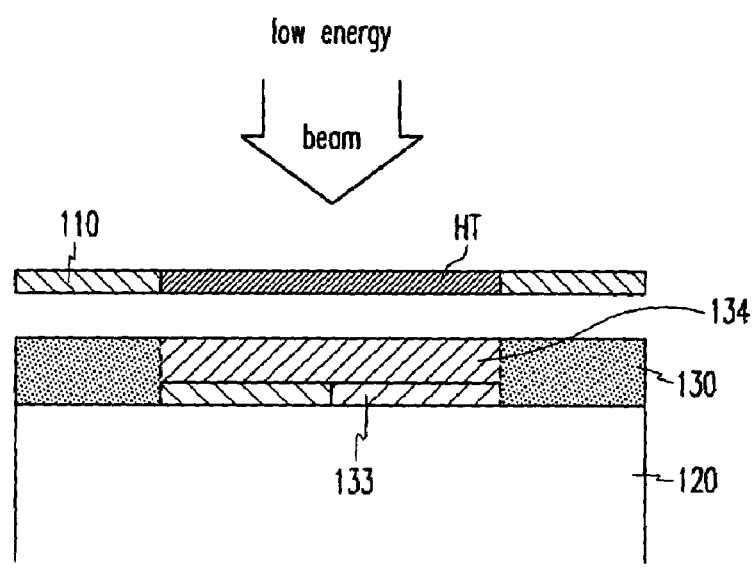

Referring to FIG. 2E, the polycrystallization mask 110 is moved in the transverse direction by the transverse pitch such that the translucent film HT of the translucent slits 111 are aligned with the portions of the amorphous silicon film 130, which have experienced the crystallization. The illumination of a laser beam through the mask 110 transforms the top of the crystallized regions 133 into liquid phase regions 134 such that the protuberances are removed.

Figure 2F:
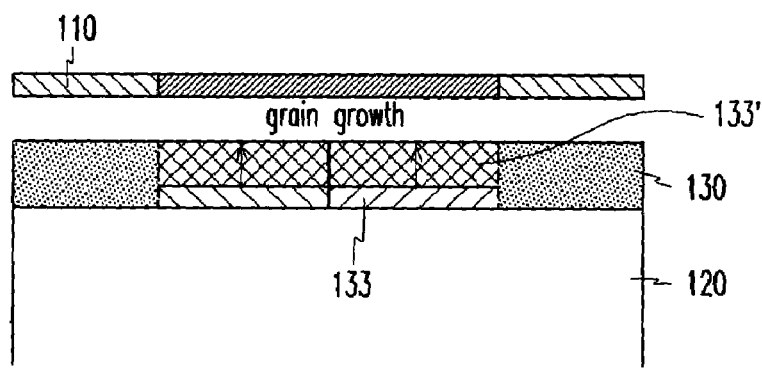

Referring to FIG. 2F, the liquid amorphous silicon in the liquid phase regions 134 is cooled down again to be recrystallized. The re-crystallization starts from bottom surfaces of the liquid phase regions 134 contacting the crystallized regions 133, and proceeds in an upward direction perpendicular to the bottom surfaces to form re-crystallized regions 133'.

Each of the above-described steps with reference to FIGS. 2A to 2F is performed twice with a half of the transverse pitch. Since the slit columns have a pitch equal to a half of the transverse pitch as shown in FIG. 1 and the slits 111 in adjacent columns are offset, the entire portion of the amorphous silicon film 139 is crystallized.

Referring back to FIG. 1, since the slit width defines the width of the grains, the size of the grains is controlled by adjusting the width and pitch of the slits 111.

Since this method does not require an additional step of dehydrogenation, it simplifies the manufacturing method as well as it prevents the deterioration of the characteristics of TFTs including the polysilicon film.

A polysilicon TFT and a manufacturing method thereof using a sequential lateral solidification with the mask shown in FIG. 1 according to embodiments of the present invention will be described with reference to FIGS. 3–4F.

Figure 3:
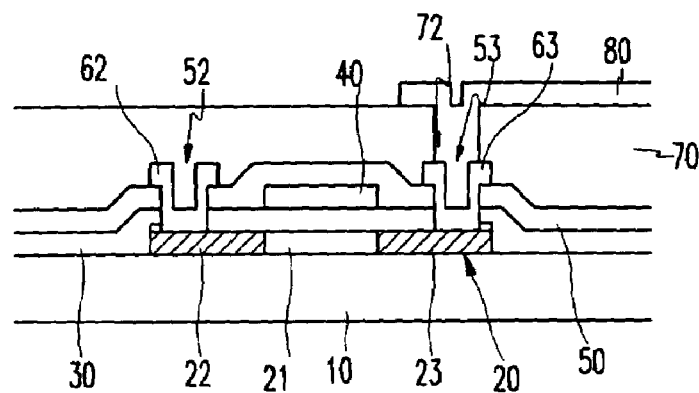
FIG. 3 is a sectional view of a polysilicon TFT according to an embodiment of the present invention.

FIG. 3 is a sectional view illustrating a structure of a polysilicon TFT according to an embodiment of the present invention.

As shown in FIG. 3, a semiconductor layer 20 made of polysilicon is formed on an insulating substrate 10. The semiconductor layer 20 includes a channel region 21 and source and drain regions 22 and 23 opposite each other with respect to the channel region 21. Here, the source and the drain regions 22 and 23 are doped with n type or p type impurity and may include a silicide layer.

A gate insulating layer 30 preferably made of $SiO_2$ or $SiN_x$ and covering the semiconductor layer 20 is formed on the substrate 10, and a gate electrode 40 is formed on the gate insulating layer 30 opposite the channel region 21. Although not shown in the drawings, a gate line connected to the gate electrode is preferably added on the gate insulating layer 30.

An interlayer insulating layer 50 covering the gate electrode 40 is formed on the gate insulating layer 30, and the gate insulating layer 30 and the interlayer insulating layer 50 have contact holes 52 and 53 exposing the source and the drain regions 22 and 23.

A source electrode 62 and a drain electrode 63 are formed on the interlayer insulating layer 50. The source electrode 62 is connected to the source region 22 via the contact hole 52, and a drain electrode 63 is opposite the source electrode 62 with respect to the gate electrode 40 and connected to the drain region 23 via the contact hole 53. On the interlayer insulating layer 50, although not shown in the drawings, a data line connected to the source electrode 62 is preferably added.

A passivation layer 70 made of silicon nitride, SiOC, SiOF or organic insulating material is formed on the interlayer insulating layer 50. A pixel electrode 80 connected to the drain electrode 63 via a contact hole 72 in the passivation layer 70 is formed on the passivation layer 70.

A buffer layer may be provided between the substrate 10 and the semiconductor layer 20 in this TFT.

Next, a method of manufacturing the polysilicon TFT shown in FIG. 3 according to an embodiment of the present invention will be described with reference to FIG. 3 and FIGS. 4A to 4F.

FIGS. 4A to 4F are sectional views of the polysilicon TFT in the intermediate steps of a manufacturing method thereof according to an embodiment of the present invention.

Figure 4A:
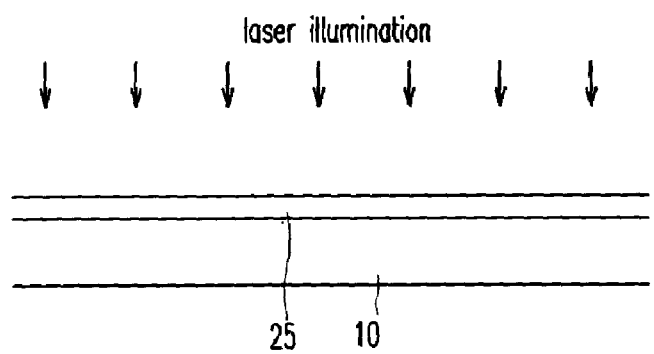
FIGS. 4A to 4F are sectional views of the polysilicon TFT shown in FIG. 3 in the intermediate steps of a manufacturing method thereof according to an embodiment of the present invention.

First, as shown in FIG. 4A, a thin film of amorphous silicon is deposited on a substrate 10 by low pressure chemical vapor deposition ("CVD"), plasma enhanced CVD or sputtering, and then, a polycrystallization mask 110 shown in FIG. 1 is aligned with the substrate 10. Thereafter, a polysilicon thin film 25 is formed using eximer laser crystallization or lateral solidification process. That is, the amorphous silicon thin film is irradiated with a laser beam through the mask 110 to be melted into a liquid phase, and then, cooled down to form grains. Since the detailed steps of the polycrystallization are described above with reference to FIGS. 2A–2F, the description thereof is omitted. As described above, since the crystallization step in this embodiment does not require an additional step of dehydrogenation, it simplifies the manufacturing method as well as it prevents the deterioration of the characteristics of TFTs.

Figure 4B:
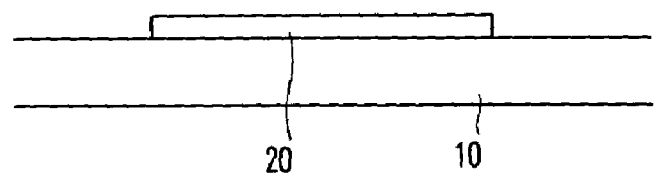

Next, as shown in FIG. 4B, the polysilicon thin film 25 is patterned by photo etching using an active mask to form a semiconductor layer 20.

Figure 4C:
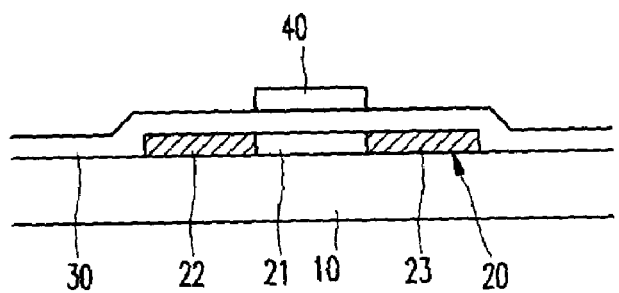

Then, as shown in FIG. 4C, silicon oxide or silicon nitride is deposited to form a gate insulating layer 30, and then, a conductive material for a gate wire is deposited and patterned to form a gate electrode 40 on a channel region 21 of the semiconductor layer 20. Next, p type or n type impurities are ion-implanted into the semiconductor layer 20 using the gate electrode 40 as a mask, and activated to form source and drain regions 22 and 23 opposite each other with respect to the channel region 21.

Figure 4D:
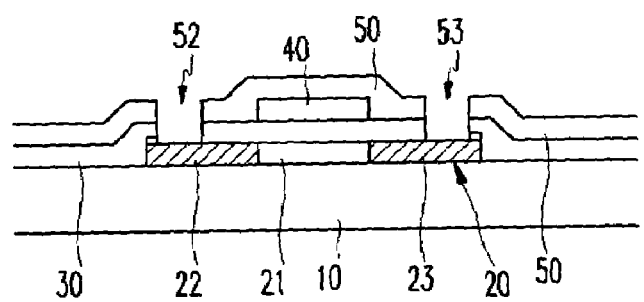

Next, as shown in FIG. 4D, an interlayer insulating layer 50 covering the gate electrode 40 is formed on the gate insulating layer 30, and then, the interlayer insulating layer 50 as well as the gate insulating layer 30 is patterned to form contact holes 52 and 53 exposing the source and the drain regions 22 and 23 of the semiconductor layer 20.

Figure 4E:
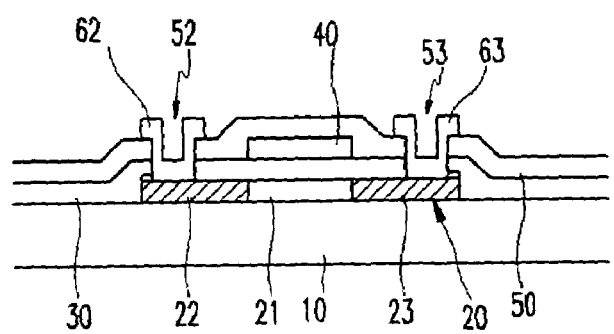

Next, as shown in FIG. 4E, a metal for a data wire is deposited on the insulating substrate 10 and patterned to form a source electrode 62 and a drain electrode 63 connected to the source region 22 and the drain region 23 via the contact holes 52 and 53, respectively.

Figure 4F:
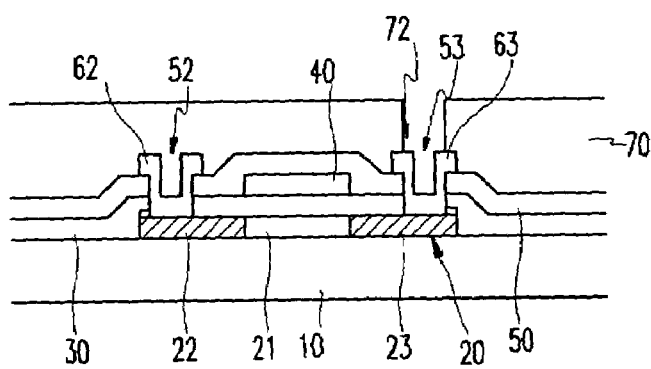

Next, as shown in FIG. 4F, an insulating material is deposited on the insulating substrate 10 to form a passivation layer 70, and then patterned to form a contact hole 72 exposing the drain electrode 63.

Next, as shown in FIG. 3, a transparent conductive material such as ITO (indium tin oxide) or IZO (indium zinc oxide), or a reflective conductive material is deposited and patterned to form a pixel electrode 80.

Although the manufacturing process of the TFT has been described to include the step of forming the pixel electrode, the technique of the present invention is also applicable to a manufacturing process of a polysilicon thin film used as a switching element of a display device such as an organic EL device.

As described above, the present invention performs polycrystallization with a mask having transmissive areas with different transmittances and simultaneously removes hydrogen from the polycrystalline film and the protuberances. This makes the manufacturing method simplified as well as it prevents the deterioration of the characteristics of TFTs.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A polycryslallization mask for laser illumination for converting amorphous silicon into polysilicon, the mask comprising:
   a first transmissive slit having a first light transmittance;
   a second transmissive slit having a second light transmittance different from the first light transmittance; and
   an opaque area disposed at surroundings of the first and second transmissive slits,
   wherein the first and second transmissive slits are isolated from each other by the opaque area.

2. The mask of claim 1, wherein the first transmissive slit is translucent so that the first transmissive slit partly transmits light.

3. The mask of claim 2, wherein the second transmissive slit is transparent so that the second transmissive slit completely transmits light.

4. The mask of claim 1, wherein the mask includes a plurality of first transmissive slits and a plurality of second transmissive slits, the first and second transmissive slits are arranged with a transverse pitch in a moving direction of the mask and with a longitudinal pitch in a column direction to form a plurality of slit columns arranged with a second pitch substantially equal to half of the transverse pitch substantially perpendicular to the moving direction.

5. The mask of claim 4, wherein the first transmissive slits in adjacent two of the slit columns are include first column slits and second column slits, the first and second column slits being arranged in the column direction, each of the first column slits being offset to correspond one of the second column slits by a half of the longitudinal pitch.

6. The mask of claim 5, wherein either of the first transmissive areas and the second transmissive areas and the slit columns include first and secondcolumns adjacent to each other and including the first transmissive areas and third and foruth columns adjacent to each other and including the second transmissive areas slits include third column slits and fourth column slits, the third and fourth column slits being arranged in the column direction, each of the third column slits being offset to corresponding one of the fourth column slits by a half of the longitudinal pitch.

7. The mask of claim 6, wherein the first, second, third and fourth column slits constitute first, second, third and fourth columns, respectively, that are sequentially arranged in the moving direction.

8. The mask of claim 1, wherein the first transmissive slit has only the first light trnsmittance.

9. The mask of claim 1, wherein the second transmissive slit has only the second light transmittance.

10. A polycrystallization mask for laser illumination for converting amorphous silicon into polysilicon, the mask comprising:
    a plurality of first areas each including a plurality of first transmissive slits each having a first light transmittance, the first transmissive slits being isolated from each other by a first opaque portion; and
    a plurality of second areas each including a plurality of second transmissive slits each having a second light transmittance, the second transmissive slits being isolated from each other by a second opaque portion.

11. The mask of claim 10, wherein the first areas and the second areas are alternately arranged.

12. The mask of claim 10, wherein the first transmissive slits are translucent so that the first transmissive slits partly transmit light.

13. The mask of claim 12, wherein the second transmissive slits are transparent so that the second transmissive slits completely transmit light.

14. The mask of claim 10, wherein the first and second transmissive slits are arranged with a first pitch in a first direction, and first or the second slit portion in each of the first and the sccond areas each include fifth and sixth slit portions first and second sets of slits that are offset with to each other by a half of the first pitch in a second direction.

15. The mask of claim 14, wherein the first second sets of slits form first and second slit columns, respectively, that are sequeutially arranged in a second direction substantially perpendicular to the first direction.

16. The mask of claim 10, wherein the first transmissive slits each have only the first light transmittance.

17. The mask of claim 10, wherein the second transmissive slits each have only the second light transmittance.

* * * * *